(12) United States Patent
Budde et al.

(10) Patent No.: US 8,420,979 B2
(45) Date of Patent: Apr. 16, 2013

(54) METHOD AND APPARATUS FOR LASER BEAM PROCESSING OF AN ELEMENT WITH TOTAL TRANSMISSION FOR LIGHT OF A T LEAST 10-5

(75) Inventors: Felix Budde, Zurich (CH); Thomas Studer, Biberist (CH); Marc Kaelin, Zurich (CH); Dominik Rudmann, Basel (CH)

(73) Assignee: Flisom AG, Zurich (CH)

( * ) Notice: Subject to any disclaimer, the term of this patent is extended or adjusted under 35 U.S.C. 154(b) by 621 days.

(21) Appl. No.: 12/670,270

(22) PCT Filed: Jul. 24, 2007

(86) PCT No.: PCT/EP2007/057628
§ 371 (c)(1),
(2), (4) Date: Jan. 22, 2010

(87) PCT Pub. No.: WO2009/012815
PCT Pub. Date: Jan. 29, 2009

(65) Prior Publication Data
US 2010/0224604 A1   Sep. 9, 2010

(51) Int. Cl.
*B23K 15/00* (2006.01)
(52) U.S. Cl.
USPC ............. 219/121.73; 438/166; 219/121.74; 219/121.75
(58) Field of Classification Search .......... 438/151–166; 219/121.73, 121.74, 121.75, 121.76
See application file for complete search history.

(56) References Cited

U.S. PATENT DOCUMENTS

| 5,670,068 | A | 9/1997 | Kuriyama et al. |
| 2002/0109775 | A1 | 8/2002 | White et al. |
| 2003/0201578 | A1 | 10/2003 | Li et al. |

FOREIGN PATENT DOCUMENTS

| JP | 52 119339 A | 10/1977 |
| JP | 2003-324263 | 11/2003 |
| WO | WO 03/061013 A | 7/2003 |

OTHER PUBLICATIONS

Machine translation of JP 2003-324263, published Nov. 2003.*

(Continued)

*Primary Examiner* — Richard A. Booth
(74) *Attorney, Agent, or Firm* — Antonelli, Terry, Stout & Kraus, LLP.

(57) ABSTRACT

A method and an apparatus for laser beam processing of an element (12) that has a total transmittance for light of at least $10^{-5}$, comprising a laser unit (1) for generating a laser beam on one side of the to-be-processed element (12), an illumination unit (7), an imaging system (10) comprising a sensor unit on the one side of the to-be-processed element (12), the sensor unit recording residual light that results from light of the illumination unit (7), a scanning unit (2) for adjusting the laser beam processing position, and a control unit. The control unit is operatively connected to the laser unit (1), the imaging system (10) and the scanning unit (2), and the illumination unit (7) is positioned on the other side of the to-be-processed element (12) in relation to the laser unit (1). Since the to-be-processed element (12) allows light to pass through an otherwise opaque or almost opaque layer, a good contrast is obtained that is used to determine the position of the laser beam with high precision.

Therefore, high precision laser processing is possible for materials with low transmission for light and low mechanical stability like flexible thin film solar cells.

26 Claims, 2 Drawing Sheets

OTHER PUBLICATIONS

International Preliminary Report on Patentability and Written Opinion; International application No. PCT/EP2007/057628; International filing date; Jul. 24, 2007.

International Search Report and Written Opinion; International application No. PCT/EP2007/057628; International filing date; Jul. 24, 2007.

* cited by examiner

_US 8,420,979 B2_

METHOD AND APPARATUS FOR LASER BEAM PROCESSING OF AN ELEMENT WITH TOTAL TRANSMISSION FOR LIGHT OF A T LEAST 10-5

RELATED APPLICATION

This application is a U.S. national phase application of International Application No. PCT/EP2007/057628 filed Jul. 24, 2007.

TECHNICAL FIELD

The present invention is related to a method for laser beam processing of an element as well as to an apparatus therefor.

BACKGROUND AND SUMMARY

A known method for laser beam processing of thin film solar cells is disclosed in WO 03/061 013 A1. A known method for laser beam processing for trimming a resistance, a reactance or a capacitance of a circuit board after each electronic component is mounted to the circuit board is disclosed in U.S. Pat. No. 5,670,068.

In the known method for laser beam processing mentioned above, a laser beam is deflected by scanning mirrors and focused onto an element to be processed. Due to temperature and long term drift of the scanning mirrors the lateral precision is limited. The precision is further reduced, if large area substrates are used.

In case a to-be-processed element has a low mechanical stability, like foils, it is even more difficult to exactly establish the position of the laser beam relative to structures from an earlier processing step.

To avoid such problems, a camera with suitable optics is used to determine the exact position of the laser beam. Since for high precision laser scribing, the field of view is limited for the required large magnification, either a plurality of cameras is necessary for a large area, or the field of view of the camera has to be scanned over the processing area, preferably by coupling with the scanning optic of the laser beam delivery. In the latter case, a dichotic beam splitter or a switch-able mirror is placed into the path of the laser beam to separate the laser beam from the observation light followed by optical components to compensate the chromatic error of the focusing optic, if different wavelengths are used.

Therefore, a to-be-processed element having a low contrast, i.e. an element comprising layers with a light transmission ratio (total transmittance) below 10% as they can be found in thin film solar cells, may not be suitable for image processing using the known methods for the following reasons.

Due to the fact that the angle of reflection changes during scanning, if illumination is not completely diffuse, the intensity of the reflected light from the illumination reaching the imaging optic changes considerably. Therefore, a homogeneously illuminated image suitable for machine vision is hard to achieve. Especially in the case of a to-be-processed element with a light transmission below 10%, reflections from the top surface may be more intense than from structures in one or several underlying layers. The contrast of the image may not be suitable for image recognition in this case.

In summary, it is a difficult task to precisely structure layers on substrates with low transmission and dimensional stability with the known teaching.

It is therefore one object of the present invention to overcome the above-mentioned difficulties and disadvantages of the known methods and apparatus for laser beam processing.

This and other objects are reached by the features given in claim 1. Further embodiments as well as an apparatus are defined in further claims.

The present invention is directed to a method for laser beam processing of an element, be it flat or curved, that has a total transmittance for light of at least $10^{-5}$. The method comprises the steps of:
  processing the to-be-processed element on one side by a laser beam;
  illuminating the to-be-processed element on the other side by light of a illumination unit, the light having at least one predetermined wavelength;
  recording residual light on the one side, which residual light results from a light transmission through the to-be-processed element by light of the illuminating unit;
  determining laser beam processing position by analyzing the recorded residual light; and
  adjusting the laser beam processing position.

An embodiment of the present invention is further characterized by
  providing at least one alignment mark on the to-be-processed element; and
  determining laser beam processing position relative to the alignment mark.

The alignment mark is clearly visible in the acquired image because the contrast is significantly increased due to the positioning of the illumination unit on the other side of the element to be processed with respect to the recording unit for the residual light. As a result thereof, the position of the laser beam or the position of the to-be-processed element in relation to the laser beam can be calculated with high precision by image processing.

Another embodiment is characterized by
  providing alignment marks on the to-be-processed element;
  monitoring position of the alignment mark; and
  adjusting laser beam processing relative to the position of the alignment mark.

A further embodiment is characterized by further comprising the step of focusing the laser beam at a predefined layer of the to-be-processed element.

A further embodiment is characterized by using a scanning unit for adjusting the laser beam processing position.

A further embodiment is characterized by using mounting means for adjusting the laser beam processing position.

The mounting means is placed, for example, in-between the illumination unit and the focusing optic such that the light is transmitting the alignment mark and the to-be-processed element and is collected by the imaging optic on the side of the laser unit.

A further embodiment is characterized by
  providing conditioning means for conditioning the laser beam before it is used for laser beam processing, and
  using at least some of the conditioning means for treating the residual light before the step of recording the residual light.

A further embodiment is characterized in that the to-be-processed element is flexible and in particular comprises a substrate and at least one layer to be processed.

Furthermore, an apparatus for laser beam processing of an element that has a total transmittance for light of at least $10^{-5}$ is disclosed. The inventive apparatus comprises:
  a laser unit for generating a laser beam on one side of the to-be-processed element;

an illumination unit;

an imaging system comprising a sensor unit on the one side of the to-be-processed element, the sensor unit recording residual light that results from light of the illumination unit;

a scanning unit for adjusting the laser beam processing position; and a control unit, wherein the control unit is operatively connected to the laser unit, the imaging system and the scanning unit, characterized in that the illumination unit is positioned on the other side of the to-be-processed element in relation to the laser unit.

The present invention particularly relates to an apparatus for high precision laser beam processing of multilayered thin films on substrates, e.g. polymer or glas with a total transmittance for light as low as $10^{-5}$ at the illumination wavelength, for example, organic light emitting diodes and, more particularly, thin film solar cells of Si and compound semiconductors, especially based on ternary chalcogenide semiconductors, which consist of an element or a combination of elements from group 11 of the periodic table of elements, an element or a combination of elements from group 13, and an element or a combination of elements from group 16 (chalcogen group) in any ratio.

More particularly, a ternary chalcopyrite compound with composition $(Cu_xAg_{1-x})_1(In_uGa_vAl_w)_1(Se_yS_{1-y})_2$ may be used, where $0 \leq x \leq 1$, $0 \leq y \leq 1$, $u+v+w=1$. It may be advantageous to have some deviations from the exact 1:1:2 stoichiometry. For example a slightly Cu deficient composition of $Cu_{0.9}(In_{0.75}Ga_{0.25})_{1.1}Se_2$ may be used or compositionally graded single or multilayers.

An embodiment of the invention is characterized in that the to-be-processed element comprises at least one alignment mark.

A further embodiment of the invention is characterized by further comprising a focusing optic for the laser beam, the focusing optic being positioned in-between the scanning unit and the element to be processed.

A further embodiment of the invention is characterized in that the focusing optic is positioned in-between the laser unit and the scanning unit.

A further embodiment of the invention is characterized by further comprising mounting means for further adjusting the laser beam processing position.

A further embodiment of the invention is characterized in that the to-be-processed element is flexible and in particular comprises a substrate and at least one layer to be processed.

A further embodiment of the invention is characterized in that the residual light and the laser beam are conditionable by at least the focusing optic and/or the scanning unit.

A further embodiment of the invention is characterized by further comprising a separation unit for separating the residual light from the laser beam.

A further embodiment of the invention is characterized by further comprising optical elements to correct chromatic aberrations of the focusing optic.

A further embodiment of the invention is characterized in that the to-be-processed element (12) comprises at least one layer having at least one of the following characteristics:
 a metallic or semi-metallic conductivity used as electrical contact in solar cells;
 a semiconductor used as absorber layer in solar cells;
 a ternary chalcopyrite semiconductor used as absorber layer in solar cells with composition $(Cu_xAg_{1-x})_1(In_uGa_vAl_w)_1(Se_yS_{1-y})_2$ with $0 \leq x \leq 1$, $0 \leq y \leq 1$, $u+v+w=1$;
 a transparent electrically conductive material used as electrical contact in solar cells.

A further embodiment of the invention is characterized in that the to-be-processed element comprises a substrate consisting of at least one of the following:
 polymer;
 polyimide;
 glass.

A further embodiment of the invention is characterized in that the illumination unit emits at least one wavelength larger than 800 nm.

A further embodiment of the invention is characterized in that the imaging system comprises the same focusing optic used to focus the laser beam, which is an F-Theta lens color corrected for 532 nm and 1064 nm, and a dichotic beam splitter to separate both wavelength, wherein the laser unit emits a wavelength of 532 nm, and wherein the illumination unit emits at least light at a wavelength of 1064 nm.

A further embodiment of the invention is characterized in that the illumination unit emits a laser light having a wavelength of 1064 nm, and the laser unit uses a part of this light to generate 532 nm laser light for laser beam processing.

A further embodiment of the invention is characterized in that the mounting means comprise a vacuum chuck made from a translucent porous material with transmission at a wavelength of the light of the illumination unit.

To-be-processed elements with low dimensional stability, like foils, require a rigid support to keep the layer to be processed within the focal depth (Rayleigh length) of the laser beam, which is small, if a small size of laser focus is required. Therefore, a mounting means, like an electrostatic or vacuum chuck, is required, which is usually opaque. Illumination comprising one or a plurality of lamps, LEDs (Light Emitting Diodes) or lasers is therefore placed adjacent to the camera such that the light is reflected from the to-be-processed element into the imaging optic, either directly or diffusely.

A further embodiment of the invention is characterized in that the mounting means comprise at least two rotate-able cylinder shaped rolls arranged parallel to each other, where the flexible element is positioned in a tangent plane of said rolls, which lies in a focal plane of the focusing optic, and the illumination unit is placed such that the light of the illumination unit is passing between the rolls.

A further embodiment of the invention is characterized in that the mounting means comprise a convexly shaped surface with transmission at a wavelength of light of the illumination unit, where the flexible element is positioned at the surface, which lies within a focal area of the focusing optic.

A further embodiment of the invention is characterized in that the mounting means comprise a rotate-able cylinder-shaped roll with transmission at a wavelength of light of the illumination unit, where the flexible element is positioned along a part of a circumference of the roll, which lies within a focal area of the focusing optic.

The invention will now be described in more detail by reference to drawings showing exemplified embodiments.

DETAILED DESCRIPTION

Figure 1:
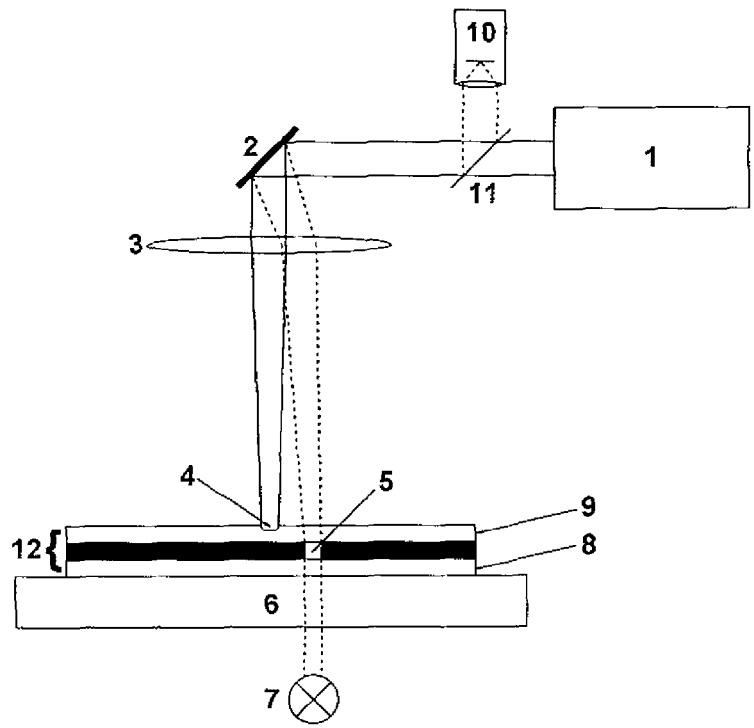
FIG. 1 schematically shows a first embodiment of an apparatus for laser beam processing according to the present invention comprising a first mounting means.

A first embodiment of an apparatus according to the present invention is schematically depicted in FIG. 1. The inventive apparatus comprises a laser unit 1, a scanning unit 2 with two galvanometer driven mirrors (for clarity only one mirror is shown in FIG. 1) to scan the beam of the laser unit 1 across a to-be-processed element 12, an focusing optic 3, an imaging system 10, a separation unit 11 and a illumination unit 7. The to-be-processed element 12 is supported by a mounting system 6, which is a plate for the embodiment depicted in FIG. 1.

It is pointed out that the term "scanning" is to be generally understood as a method to direct the impinging point of a light beam, which can be a laser beam or a light beam of an imaging system, for example, to any desired position within the area to be processed or inspected, preferably by the control of a computer. Therefore, different methods are possible. The scanning of the laser focus for laser processing can be either done by deflecting the laser beam by at least one rotate-able or moveable mirror, which may be placed before or after the focusing optic, or by moving the focusing optic relative to the element to be processed, i.e. either the focusing optic, the to-be-processed element 12 or both may be moveable, which may require the mounting means to be movable or allowing the to-be-processed element 12 to be moveable with respect to the mounting means. A combination of a moving element 12 with a moving focusing optic 3 or a beam deflection unit may be especially advantageous in a roll-to-roll process.

The to-be-processed element 12 comprises, for example, a substrate 8 as carrier and two layers, one of which comprises alignment marks that have been produced in an earlier processing step; the other one is being processed by the laser beam of the laser unit 1. In general, the to-be-processed elements 12 are, for example, multilayered thin films on substrates with at least low total transmittance for light, i.e. a total transmittance of at least $10^{-5}$ at the illumination wavelength of the illumination unit 7. Thin film solar cells on polymer or glass substrate as to-be-processed elements 12 may be based on ternary chalcogenide semiconductors comprising an element or a combination of elements according to one or several of the following in any ratio:
  an element or a combination of elements from group 11 of the periodic table of elements;
  an element or a combination of elements from group 13;
  an element or a combination of elements from group 16 (chalcogen group).

More particularly, a ternary chalcopyrite $(Cu_xAg_{1-x})_1(In_uGa_vAl_w)_1(Se_yS_{1-y})_2$ may be used, where $0 \leq x \leq 1$, $0 \leq y \leq 1$, $u+v+w=1$. It may be advantageous to have some deviations from the exact 1:1:2 stoichiometry. For example, a slightly Cu deficient composition of $Cu_{0.9}(In_{0.75}Ga_{0.25})_{1.1}Se_2$ may be used or compositionally graded single or multilayer.

The focusing optic 3 comprises an F-Theta lens keeping the focus 4 of the laser beam at the layer 9 of the element 12 to be processed. The imaging system 10 comprises photographic means, e.g. a CCD-(Charged Coupled Device) camera that is sensitive at the wavelength emitted by the illumination unit 7 and that is coupled to the focusing optic 3 of the laser beam delivery. Therefore, the separation unit 11 has to be placed into the beam path to separate illumination from laser light. Thereto, a dichotic beam splitter is provided if different wavelengths are used, or a switch-able mirror to switch between image acquisition and laser processing is provided if the same wavelengths are used. In the case of different wavelengths and use of an F-Theta lens, which is not fully color corrected for both wavelength, additional optical components may be necessary to compensate the chromatic aberration of the F-Theta lens. The substrate 8 with the to-be-processed layer 9, which have at least low transmission for light, is held precisely in place at the foci of the laser beam and imaging optics onto the mounting means 6.

The mounting means 6 comprise, for example, a vacuum chuck made from a translucent porous ceramic plate with sufficient transmission for light from the illumination unit 7 with a suitable wavelength to be described later.

In the particular application of structuring thin film solar cells, especially $(Cu_xAg_{1-x})_1(In_uGa_vAl_w)_1(Se_yS_{1-y})_2$ solar cells, the layer containing the alignment mark 5 is normally the so called back contact comprising an electrically conductive metallic or metal-like material (e.g. Mo, TiN), which has no transmission over a wide wavelength range. The so called absorber layer to be processed is usually opaque in the visible, but has some transmission in the IR-(Infrared) near or above the absorption edge of the semiconductor used. In the case of a $(Cu_xAg_{1-x})_1(In_uGa_vAl_w)_1(Se_yS_{1-y})_2$ absorber layer, illumination with near-IR light with a wavelength above 800-1050 nm, depending on exact composition of the material, results in a sharp image well suited for image processing.

The alignment mark 5 is, for example, a line in the back contact, where the back contact material was removed in order to obtain an electrical insulation. In this case, images at different positions along the line (alignment mark 5) may be taken and the position of the line measured by image processing. The position of the line in-between the positions measured may be calculated e.g. by polynomial interpolation. In the next step, the absorbing layer can be laser processed at a precisely determined position relative to the alignment mark 5. In the particular case, the material of the absorbing layer is usually removed along a line with a certain distance to the alignment line 5 to allow electrical connection of the exposed back contact with an electrically conductive front contact to be deposited in a further step.

Alternatively, image processing may be performed in real time, i.e. while laser processing takes place. In this case, the distance between the laser spot and the alignment mark 5 is continuously measured by image processing or a position sensitive optical device during scanning and kept constant due to correcting means. The alignment mark 5 can also be used for high precision laser processing of the front contact in a further laser processing step. Furthermore, said image processing can be used to control laser processing of the back contact, which creates said alignment mark 5 used in the laser processing steps described above.

As an example, laser light with a wavelength of 532 nm may be used for laser processing of individual layers of thin film $(Cu_xAg_{1-x})_1(In_uGa_vAl_w)_1(Se_yS_{1-y})_2$ solar cells on polyimide substrate. For the illumination, a wavelength of 1064 nm may be chosen, where substrate and absorbing layer have transmission. Scanning of the laser beam and image acquisition may be done with a galvanometer scanner comprising two galvanometer driven mirrors with high reflection coatings for 532 and 1064 nm, an F-Theta lens chromatically corrected for 532 and 1064 nm, and a dichotic beam splitter to separate the two wavelengths. Image acquisition is done using a CCD camera at least sensitive at a wavelength of 1064 nm. Illumination may comprise broadband emitting IR-(Infrared)-lamps, IR-LEDs (Infrared Light Emitting Diode) or any other light source covering the spectral region around 1064 nm. In this case, a narrow band band-pass filter with transmission at 1064 nm is placed in front of the camera to avoid blurring of the image due to chromatic aberrations of the F-theta lens. Alternatively, a laser emitting at 1064 nm could be used for illumination, which may be identical with the laser used to generate the laser light with a wavelength of 532 nm.

In a further embodiment of the present invention, the imaging system 10 is not coupled to the laser beam delivery optic. Instead, a separate imaging optic is used. For example, one or a plurality of separate CCD cameras equipped with individual optics pointing with their fields of view at the alignment marks 5, and therefore collect the light from the illumination unit 7, which is passing through the mounting means 6, the substrate 8, the alignment mark 5 and the layer or layers to be processed.

Figure 2:
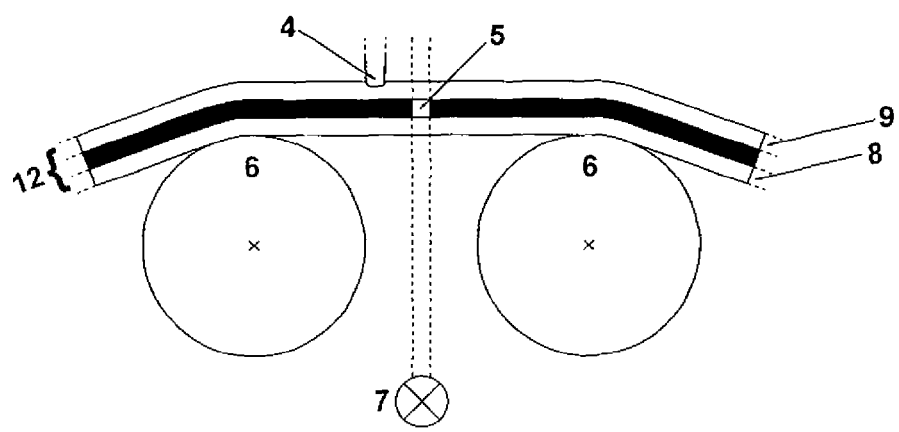
FIG. 2 shows a second embodiment of the present invention comprising a second mounting means.
Figure 3:
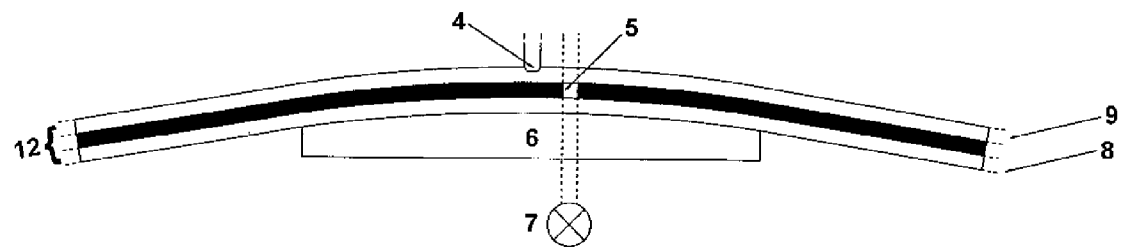
FIG. 3 shows a third embodiment of the present invention comprising a third mounting means.
Figure 4:
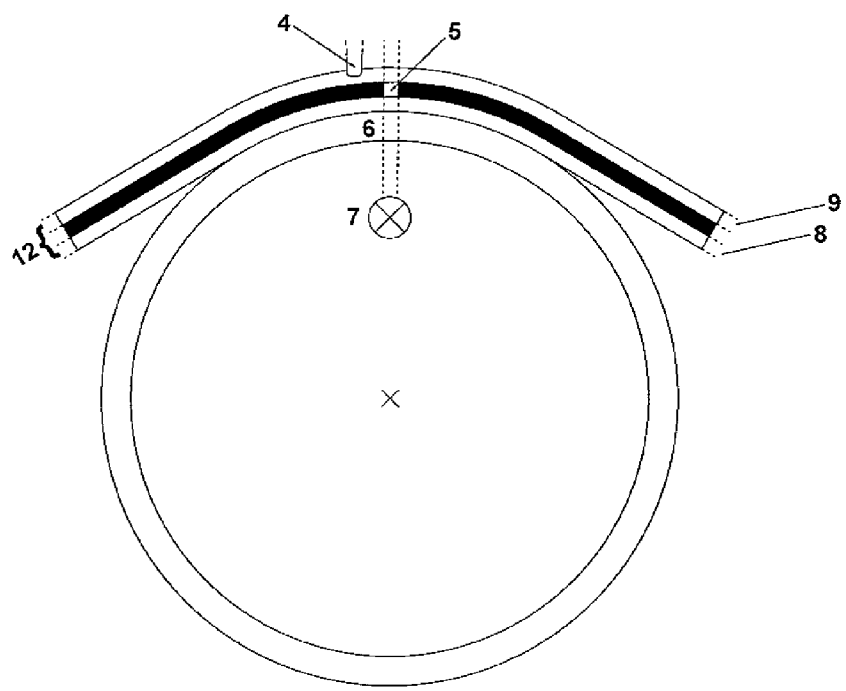
FIG. 4 shows a fourth embodiment of the present invention comprising a fourth mounting means.

FIGS. 2 to 4 show further embodiments for mounting means 6, which are in particular useful for delivering the to-be-processed element 12 to the laser processing apparatus in a continuous manner.

For example, FIG. 2 shows mounting means 6 particularly suitable in a roll-to-roll production. This embodiment of the present invention is particularly suitable for flexible to-be-processed elements 12. The mounting means 6 comprise at least two cylindrical rolls, which are parallel to each other, where the flexible to-be-processed element 12 is held in place by the tension of the web in the tangent plane of said rolls, which lies in the focal plane of said focusing optic 3 (FIG. 1). The rolls are mounted such that free rotation with low friction is enabled, when the web is moving, e.g. by using ball bearings. Transmission for light is provided due to the fact that the area in-between the rolls is not obscured. Therefore, any transparent or opaque material can be used for the rolls. The illumination unit 7 may be placed between the rolls.

In yet another embodiment of the present invention, particularly suitable for flexible substrates in a roll-to-roll production (FIG. 3), the mounting means 6 have a convex surface, which lies in the focal area of the focusing optic 3, and transmission at the wavelength of the illumination unit 7. The mounting means 6 comprise, for example, a vacuum or electrostatic chuck with convex surface or a smooth convex surface, where the flexible to-be-processed element 12 is held in place by the tension of the web. In the latter case the mounting means 6 consist, for example, of glass, translucent ceramic or polymer.

In yet another embodiment of the present invention, also particularly suitable for flexible to-be-processed elements 12 in a roll-to-roll production (FIG. 4), the mounting means 6 comprise a cylindrical roll consisting of a rod or tube of material with transmission at the wavelength of the illumination unit 7, which is made, for example, of glass or translucent ceramic. The roll is mounted such that free rotation with low friction is enabled, when the web is moving, e.g. by using ball bearings. The to-be-processed element 12 is held in place by the tension of the web at the part of the surface of the roll, which lies in the focal area of the focusing optic 3. The illumination unit 7 may be placed inside or outside the cylinder. The mounting means 6 avoid problems of friction arising when the substrate web is moved with tension along a curved surface.

Although the present invention has been explained in detail in different embodiments referring to accompanying drawings, those skilled in the art will notice that various modifications to the present invention are possible. These are to be understood as being included within the scope of the present invention as defined by the appended claims.

The invention claimed is:

1. A method for laser beam processing of an element, the to-be-processed element being a flexible element having a total transmittance for light of at least $10^{-5}$, the method comprising the steps of:
   processing the to-be-processed element on one side by a laser beam;
   illuminating the to-be-processed element on the other side by light of a illumination unit, the light having at least one predetermined wavelength;
   recording residual light on the one side, which residual light results from a light transmission through the to-be-processed element by light of the illuminating unit;
   determining laser beam processing position by analyzing the recorded residual light;
   adjusting the laser beam processing position;
   supporting the to-be-processed element using mounting means comprising at least two rotatable cylinder shaped rolls arranged parallel to each other, where the to-be-processed element is positioned in a tangent plane of said rolls, which lies in a focal plane of a focusing optic for the laser beam, and the illumination unit is placed such that the light of the illumination unit is passing between the rolls.

2. A method for laser beam processing of an element, the to-be-processed element being a flexible element having a total transmittance for light of at least $10^{-5}$, the method comprising the steps of:
   processing the to-be-processed element on one side by a laser beam;
   illuminating the to-be-processed element on the other side by light of a illumination unit, the light having at least one predetermined wavelength;
   recording residual light on the one side, which residual light results from a light transmission through the to-be-processed element by light of the illuminating unit;
   determining laser beam processing position by analyzing the recorded residual light;
   adjusting the laser beam processing position;
   supporting the to-be-processed element using mounting means comprising a rotatable cylinder-shaped roll with transmission at a wavelength of light of the illumination unit, where the to-be-processed element is positioned along a part of a circumference of the roll, which lies within a focal area of a focusing optic for the laser beam.

3. An apparatus for laser beam processing of an element, the to-be-processed element being a flexible element having a total transmittance for light of at least $10^{-5}$, the apparatus comprising:
   a laser unit for generating a laser beam on one side of the to-be-processed element;
   an illumination unit;
   an imaging system comprising a sensor unit on the one side of the to-be-processed element, the sensor unit recording residual light that results from light of the illumination unit;
   a scanning unit for adjusting the laser beam processing position;
   a control unit;
   mounting means for supporting the to-be-processed element; and
   a focusing optic for the laser beam,
wherein the control unit is operatively connected to the laser unit, the imaging system and the scanning unit, and wherein the illumination unit is positioned on the other side of the to-be-processed element in relation to the laser unit, and wherein the mounting means comprise a rotatable cylinder-shaped roll with transmission at a wavelength of light of the illumination unit, and where the to-be-processed element is positioned along a part of a circumference of the roll, which lies within a focal area of the focusing optic.

4. The method of claim 1 or 2, further comprising:
providing at least one alignment mark on the to-be-processed element; and
determining laser beam processing position relative to the at least one alignment mark.

5. The method of claim 1 or 2, further comprising:
providing at least one alignment mark on the to-be-processed element;
monitoring position of the at least one alignment mark; and
adjusting laser beam processing relative to the position of the alignment mark.

6. The method of claim 1 or 2, further comprising the step of focusing the laser beam at a predefined layer of the to-be-processed element.

7. The method of claim 1 or 2, including using a scanning unit for adjusting the laser beam processing position.

8. The method of claim 1 or 2, including using the mounting means for adjusting the laser beam processing position.

9. The method of claim 1 or 2, further comprising
providing conditioning means for conditioning the laser beam before it is used for laser beam processing, and
using at least some of the conditioning means for treating the residual light before the step of recording the residual light.

10. The method of claim 1 or 2, wherein the to-be-processed element comprises a substrate and at least one layer to be processed.

11. An apparatus for laser beam processing of an element, the to-be-processed element being a flexible element having a total transmittance for light of at least $10^{-5}$, the apparatus comprising:
a laser unit for generating a laser beam on one side of the to-be-processed element;
an illumination unit;
an imaging system comprising a sensor unit on the one side of the to-be-processed element, the sensor unit recording residual light that results from light of the illumination unit;
a scanning unit for adjusting the laser beam processing position;
a control unit,
mounting means for supporting the to-be-processed element; and
a focusing optic for the laser beam,
wherein the control unit is operatively connected to the laser unit, the imaging system and the scanning unit, and wherein the illumination unit is positioned on the other side of the to-be-processed element in relation to the laser unit, and wherein the mounting means comprise at least two rotatable cylinder shaped rolls arranged parallel to each other, and wherein the to-be-processed element is positioned in a tangent plane of said rolls, which lies in a focal plane of the focusing optic, and the illumination unit is placed such that the light of the illumination unit is passing between the rolls.

12. The apparatus of claim 11 or 3, wherein the to-be-processed element comprises at least one alignment mark.

13. The apparatus of claim 11 or 3, wherein the focusing optic is positioned in between the scanning unit and the element to be processed.

14. The apparatus of claim 11 or 3, wherein the focusing optic is positioned in-between the laser unit and the scanning unit.

15. The apparatus of claim 11 or 3, wherein the mounting means is adapted for further adjusting the laser beam processing position.

16. The apparatus of claim 11 or 3, wherein the to-be-processed element comprises a substrate and at least one layer to be processed.

17. The apparatus according to claim 11 or 3, wherein the residual light and the laser beam are condition-able by at least one of the focusing optic and the scanning unit.

18. The apparatus according to claim 17, further comprising a separation unit for separating the residual light from the laser beam.

19. The apparatus according to claim 11 or 3, further comprising optical elements to correct chromatic aberrations of the focusing optic.

20. The apparatus according to claim 11 or 3, wherein the to-be-processed element comprises at least one layer having at least one of the following characteristics:
a metallic or semi-metallic conductivity used as electrical contact in solar cells;
a semiconductor used as absorber layer in solar cells;
a ternary chalcopyrite semiconductor used as absorber layer in solar cells with composition $(Cu_xAg_{1-x})_1(In_uGa_vAl_w)_1(Se_yS_{1-y})_2$ with $0 \leq x \leq 1$, $0 \leq y \leq 1$, $u+v+w=1$;
a transparent electrically conductive material used as electrical contact in solar cells.

21. The apparatus according to claim 11 or 3, wherein the to-be-processed element comprises a substrate consisting of at least one of the following:
polymer;
polyimide;
glass.

22. The apparatus according to claim 11 or 3, wherein the illumination unit emits at least one wavelength larger than 800 nm.

23. The apparatus according to claim 11 or 3, wherein the imaging system comprises a focusing optic used to focus the laser beam, which is an F-Theta lens color corrected for 532 nm and 1064 nm, and a dichotic beam splitter to separate both wavelength, wherein the laser unit emits a wavelength of 532 nm, and wherein the illumination unit emits at least light at a wavelength of 1064 nm.

24. The apparatus according to claim 11 or 3, wherein the illumination unit emits a laser light having a wavelength of 1064 nm, and the laser unit uses a part of this light to generate 532 nm laser light for laser beam processing.

25. The apparatus according to claim 11 or 3, wherein the mounting means comprising a vacuum chuck made from a translucent porous material with transmission at a wavelength of the light of the illumination unit.

26. The apparatus according to claim 11 or 3, wherein the mounting means comprise a convexly shaped surface with transmission at a wavelength of light of the illumination unit, where the to-be-processed flexible element is positioned at the surface, which lies within a focal area of the focusing optic.

* * * * *